(12) United States Patent
Yu et al.

(10) Patent No.: US 9,223,197 B2
(45) Date of Patent: Dec. 29, 2015

(54) LITHOGRAPHY AND MASK FOR RESOLUTION ENHANCEMENT

(71) Applicant: Taiwan Semiconductor Manufacturing Company, Ltd., Hsin-Chu (TW)

(72) Inventors: Shinn-Sheng Yu, Hsinchu (TW); Yen-Cheng Lu, New Taipei (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/288,698

(22) Filed: May 28, 2014

(65) Prior Publication Data
US 2014/0268087 A1    Sep. 18, 2014

Related U.S. Application Data

(63) Continuation-in-part of application No. 13/437,099, filed on Apr. 2, 2012, now Pat. No. 8,841,047.

(51) Int. Cl.
| | |
|---|---|
| *G03F 7/20* | (2006.01) |
| *G03F 1/58* | (2012.01) |
| *G03F 1/24* | (2012.01) |
| *G03F 1/48* | (2012.01) |
| *B82Y 10/00* | (2011.01) |
| *B82Y 40/00* | (2011.01) |

(52) U.S. Cl.
CPC . *G03F 1/24* (2013.01); *B82Y 10/00* (2013.01); *B82Y 40/00* (2013.01); *G03F 1/48* (2013.01); *G03F 1/58* (2013.01); *G03F 7/7015* (2013.01); *G03F 7/70191* (2013.01)

(58) Field of Classification Search
CPC ..... G03F 7/7015; G03F 7/70191; G03F 1/26; G03F 1/58; G03F 1/24
USPC .................................................. 430/5; 355/71
See application file for complete search history.

(56) References Cited

U.S. PATENT DOCUMENTS

| | | | | |
|---|---|---|---|---|
| 4,947,413 | A * | 8/1990 | Jewell et al. | 378/34 |
| 5,487,963 | A * | 1/1996 | Sugawara | 430/5 |
| 8,628,897 | B1 | 1/2014 | Lu et al. | |
| 2002/0177050 | A1 * | 11/2002 | Tanaka | 430/5 |

OTHER PUBLICATIONS

U.S. Appl. No. 14/221,555, filed on Mar. 21, 2014, by inventors Yen-Cheng Lu, Shinn-Sheng Yu, Jeng-Horng Chen, and Anthony Yen for "An Extreme Ultraviolet Lithography Process and Mask with reduced Shadow Effect and Enhanced Intensity," 27 pages of text, 8 pages of drawings.

* cited by examiner

*Primary Examiner* — Stewart Fraser
(74) *Attorney, Agent, or Firm* — Haynes and Boone, LLP

(57) ABSTRACT

A lithography process in a lithography system includes loading a mask having multiple mask states and having a mask pattern consisting of a plurality of polygons and a field. Different mask states are assigned to adjacent polygons and the field. The lithography process further includes configuring an illuminator to generate an illumination pattern on an illumination pupil plane of the lithography system; configuring a pupil filter on a projection pupil plane of the lithography system with a filtering pattern determined according to the illumination pattern; and performing an exposure process to a target with the illuminator, the mask, and the pupil filter. The exposure process produces diffracted light and non-diffracted light behind the mask and the pupil filter removes most of the non-diffracted light.

20 Claims, 16 Drawing Sheets

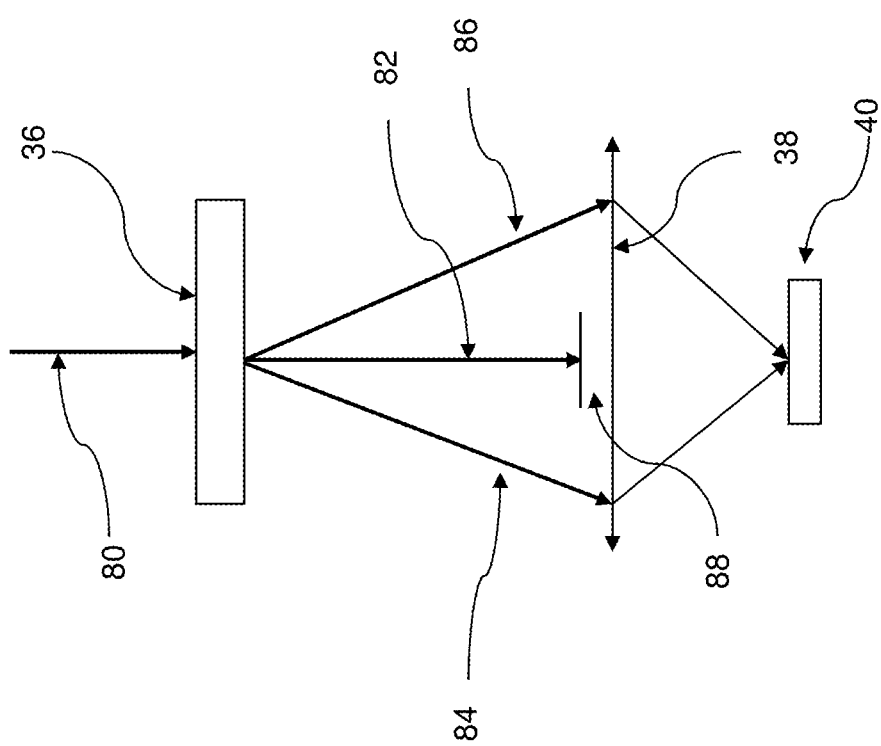

LITHOGRAPHY AND MASK FOR RESOLUTION ENHANCEMENT

This application is a continuation-in-part application of application Ser. No. 13/437,099, filed Apr. 2, 2012, entitled "An Extreme Ultraviolet Lithography Process and Mask," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. Various lithography techniques include phase shift mask and off-axis illumination. But existing technique has respective limitations needed to be overcome, such as shadowing effect.

Therefore, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a diagrammatic perspective view of the lithography system of FIG. 2, in portion, constructed in accordance with some embodiments.

DETAILED DESCRIPTION

Figure 1:
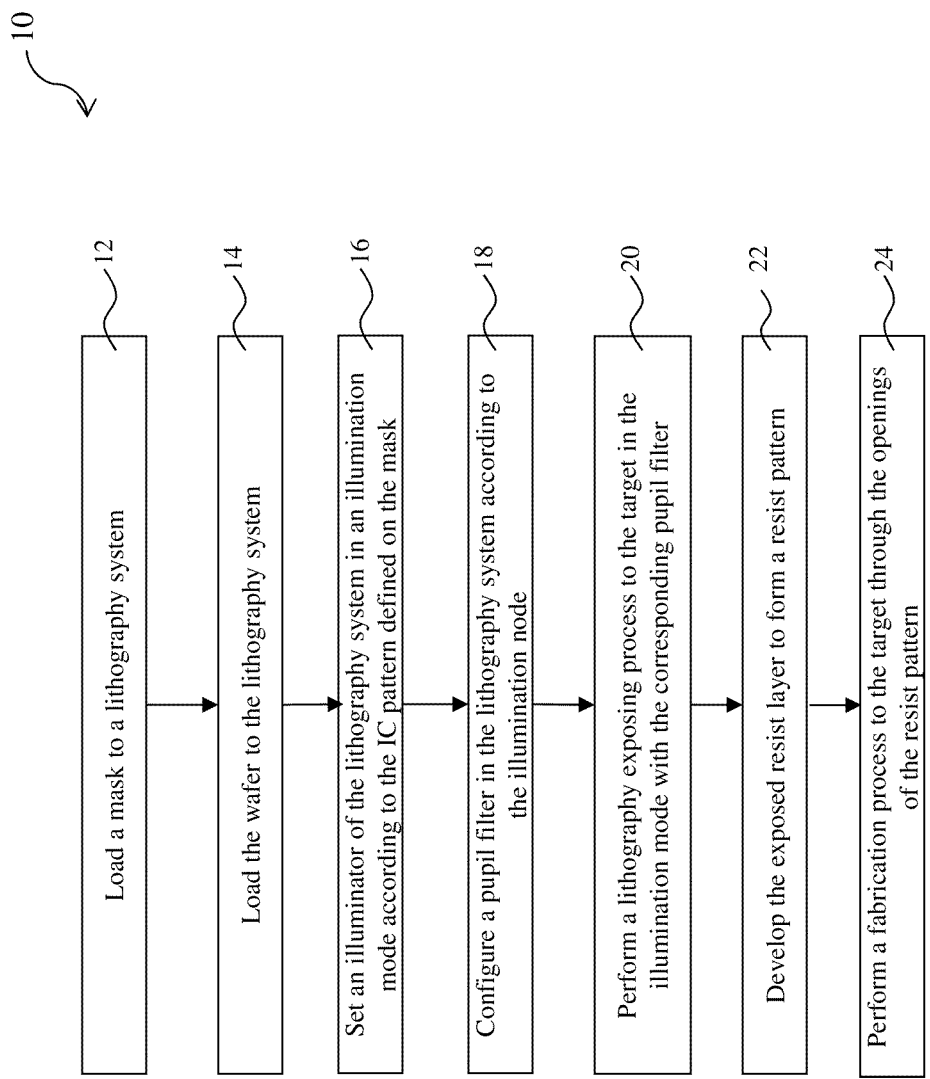
FIG. 1 is a flowchart of a lithography process constructed in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flowchart of a method 10 to perform a lithography process in an integrated circuit fabrication constructed according to aspects of the present disclosure in various embodiments. The method 10, the lithography system and the photomask (mask or reticle) implemented by the method 10 are described with reference to FIG. 1 and other figures.

Referring to FIG. 1, the method 10 includes an operation 12 by loading to a lithography system 30 with a mask 36. In the present disclosure, the mask 36 is designed to have multiple mask states (multiple states). The lithography system 30 and the mask 36 are described below respectively.

Figure 2:
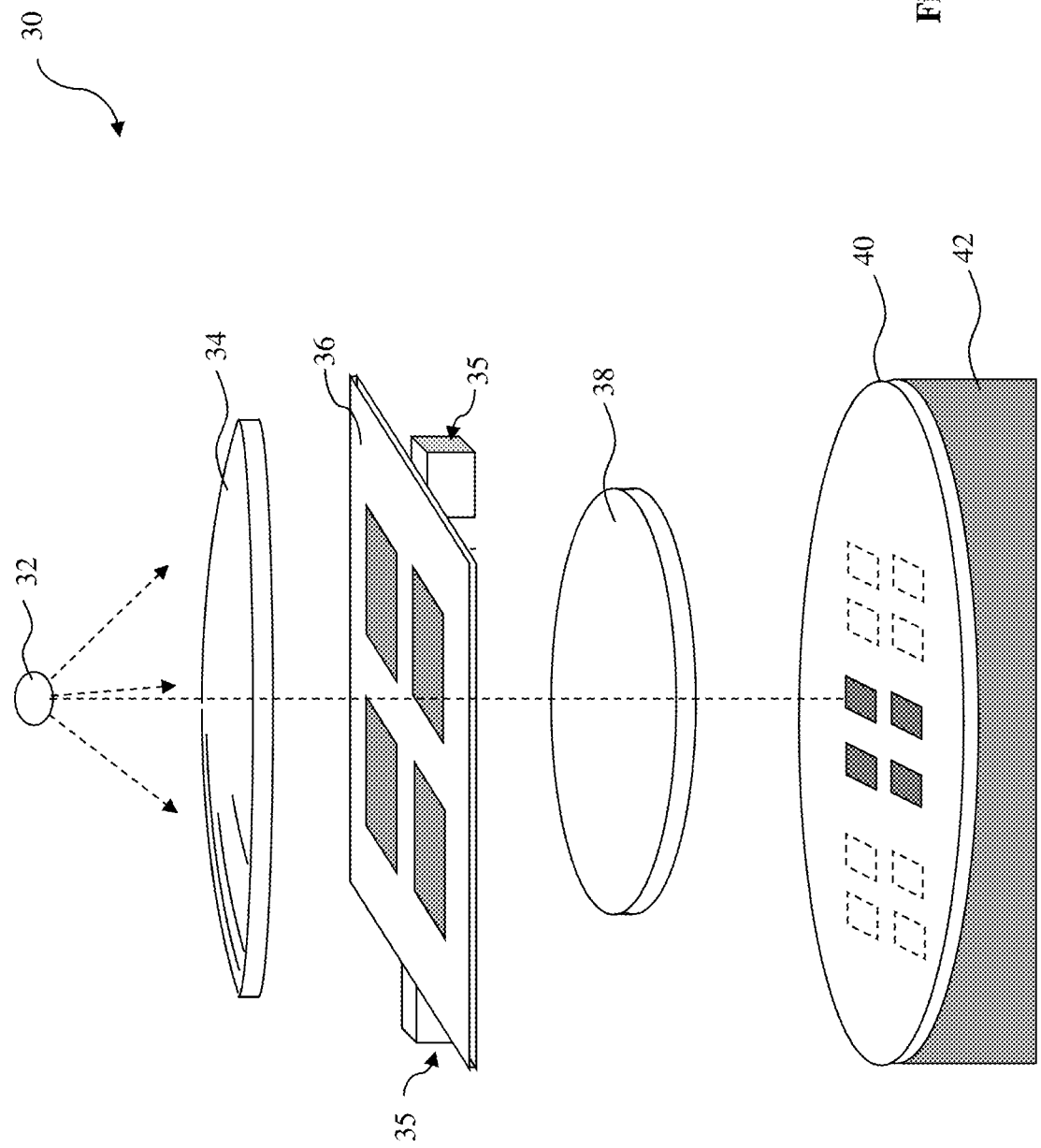
FIG. 2 is a block diagram of a lithography system for implementing the method of FIG. 1 and a mask structure constructed in accordance with some embodiments.

The lithography system 30 is illustrated in FIG. 2 in a schematic view, in accordance with some embodiments. The lithography system 30 is designed to perform a lithography exposure process to a radiation-sensitive material layer (e.g., photoresist layer or resist layer). The lithography system 30 is operated in a proper exposure mode. In some embodiments, an exposure mode is implemented such that the image of a mask is formed on an integrated circuit (IC) substrate by one shot. In some embodiments, a step-and-exposure mode is implemented such that the image of the mask is repeatedly formed on a plurality of field regions on the IC substrate. In some embodiments, a step-and-scan mode is implemented such that the image of the mask is repeatedly scanned to a plurality of field regions on the IC substrate.

The lithography system 30 employs a radiation source 32 to generate radiation energy, such as ultraviolet (UV) light. In various embodiments, the radiation source may include a UV source, or deep UV (DUV) source. For example, the radiation source 32 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; or other light sources having a desired wavelength.

In some other embodiments, the radiation source 32 includes a Fluoride ($F_2$) excimer laser with a wavelength of 157 nm or an extreme UV (EUV) source having a wavelength ranging between about 1 nm and about 100 nm. In one particular example, the EUV radiation source 32 generates a EUV light with a wavelength centered at about 13.5 nm.

The lithography system 30 also includes an optical subsystem that receives the radiation energy from the radiation source 32, modulates the radiation energy by the image of a mask and directs the radiation energy to a resist layer coated on the IC substrate. The optical subsystem includes an illuminator and a projection optics box (POB). In some embodiments, the optical subsystem is designed to have a refractive mechanism. In this situation, the optical subsystem includes various refractive components, such as lenses.

In some other embodiment where the radiation energy is from $F_2$ excimer laser or EUV radiation source, the optical subsystem is designed to have a reflective mechanism. In this situation, the optical subsystem includes various reflective components, such as mirrors.

Particularly, the lithography system 30 employs an illuminator (e.g., a condenser) 34. In some embodiments where the optical subsystem has a refractive mechanism, the illuminator 34 may include a single lens or a lens module having multiple lenses (zone plates) and/or other lens components. For example, the illuminator 34 may include microlens arrays, shadow masks, and/or other structures designed to aid in directing radiation energy from the radiation source 32 onto a mask 36.

The illuminator 32 is operable to provide an on-axis illumination (ONI) to illuminate the mask 36, where the ONI is designed according to various aspects of the present disclosure, as further described later. In some embodiments, an illumination aperture is configured to provide the on-axis illumination. In some embodiments, the illuminator 34 includes a plurality of lenses that are tunable for reconfiguration so to redirect the radiation light to different illumination positions, thereby achieving the ONI. In some other embodiments, a stage prior to the illuminator 34 may additionally include other lens or other optical components that are controllable to direct the radiation light to different illumination positions, thereby achieving the ONI.

In some other embodiments where the optical subsystem has a reflective mechanism, the illuminator 34 may employ a single mirror or a mirror system having multiple mirrors in order to direct light from the radiation source onto the mask, thereby achieving the ONI. The illuminator is operable to configure the mirrors to provide an on-axis illumination (ONI) to the mask. In one example, the mirrors of the illuminator are switchable to reflect EUV light to different illumination positions. In another embodiment, a stage prior to the illuminator 34 additionally include other switchable mirrors that are controllable to direct the EUV light to different illumination positions with the mirrors of the illuminator. Accordingly, the lithography system is able to achieve an on-axis illumination without sacrificing the illumination energy.

The lithography system 30 also includes a mask stage 35 configured to secure the mask 36 by a suitable clamping mechanism, such as vacuum clamping or e-chuck. The mask stage 35 is designed and configured to be operable for translational and rotational motions according to some embodiments.

The mask 36 may be a transmissive mask or a reflective mask. In the present embodiment, the mask 36 is a transmissive mask such as one described in further detail later.

The lithography system 30 also employs a POB 38 for imaging the pattern of the mask 36 on to a target 40 (IC substrate such as a semiconductor wafer or simply a wafer) secured on a substrate stage 42 of the lithography system 30. In some embodiments where the optical subsystem has a refractive mechanism, the POB 38 has refractive optics. The radiation light transmitted from the mask 36 is collected by the POB 38. In one embodiment, the POB 38 may include a magnification of less than one (thereby reducing the patterned image included in the radiation).

In some other embodiments where the optical subsystem has a reflective mechanism, the POB 38 has refractive optics. The radiation reflected from the mask 36 (e.g., a patterned radiation) is collected by the POB 38.

Back to the mask 36, the mask 36 includes three mask states different from each other in terms of transmissivity and optical phase (simply phase). Particularly, the three mask states have transmissivities t1, t2 and t3, respectively, and phase φ1, φ2, and φ3, respectively.

When two mask states have substantially a same phase, such as that the corresponding phase difference is about zero or multiple of 360 degree in a certain range ±Δφ, those two mask states are referred to as "in phase". If the real phase difference is within the range from 0+Δφ to 0−Δφ, it is considered as in phase. The range ±Δφ is reasonably chosen. For example, Δφ is chosen as 30 degree. Therefore, if the phase difference between two mask states is within a range from −30 degree to +30 degree, the two mask states are considered to be in phase. Similarly, when the two mask states have a phase difference about 180 degree in a certain range ±Δφ, those two mask states are referred to as "out of phase". This means that when the phase difference is within a range from 180+Δφ to 180−Δφ, the two mask states are considered to be out of phase. For example, Δφ is chosen as 30 degree. When the phase difference is within a range from 150 to 210, the two mask states are considered to be out of phase.

In some embodiments, a first polygon is defined in the first mask state, a second polygon adjacent the first polygon is defined in the second mask state and the field is defined in the third mask state. In some examples, the first and second mask states are out of phase.

The mask 36 with three mask states is designed to achieve the enhanced illumination resolution and the depth of focus (DOF) when used with the lithography system 30 and the method 10. The structure of the mask 36 and the method making the same will be further described below in accordance with some embodiments.

The mask fabrication process includes two operations: a blank mask fabrication process and a mask patterning process. During the blank mask fabrication process, a blank mask is formed by deposing suitable layers (e.g., an absorption layer) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks (for example, a set of 15 to 30 masks) may be used to construct a complete IC.

Figure 3:
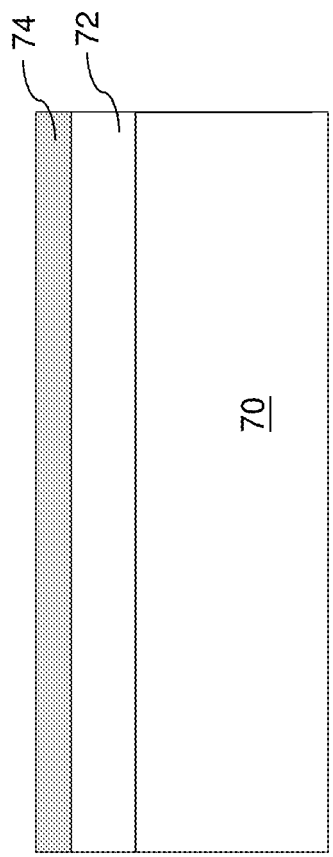
FIGS. 3-5 are cross-sectional views of a mask at various fabrication stages constructed in accordance with some embodiments.
Figure 4:
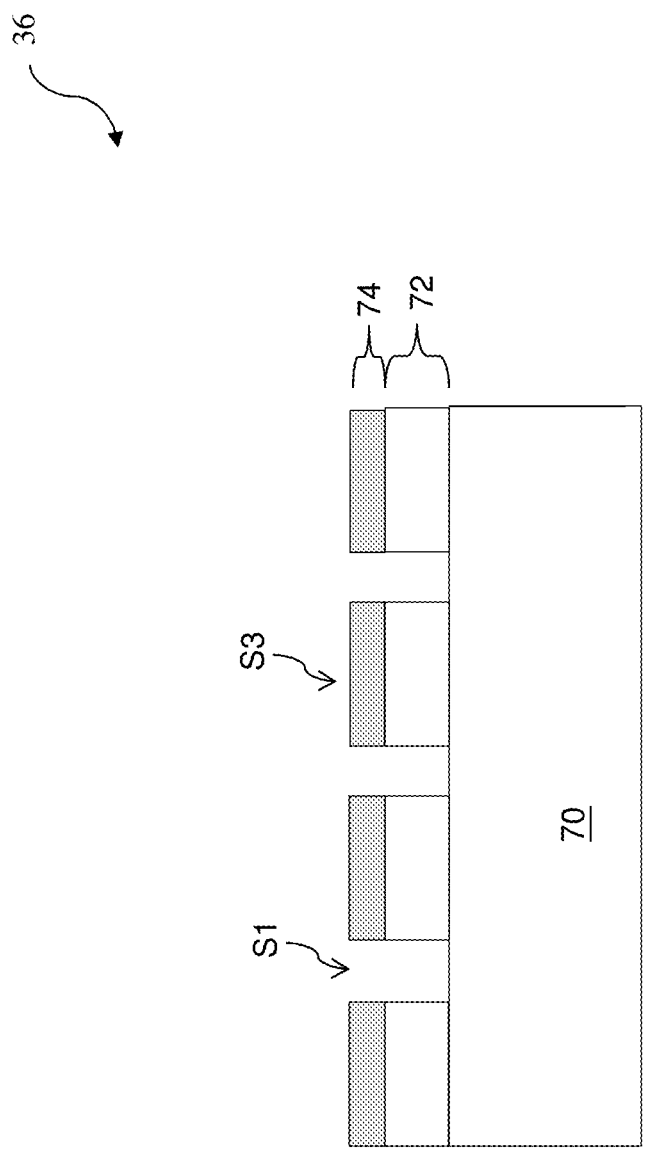
Figure 5:
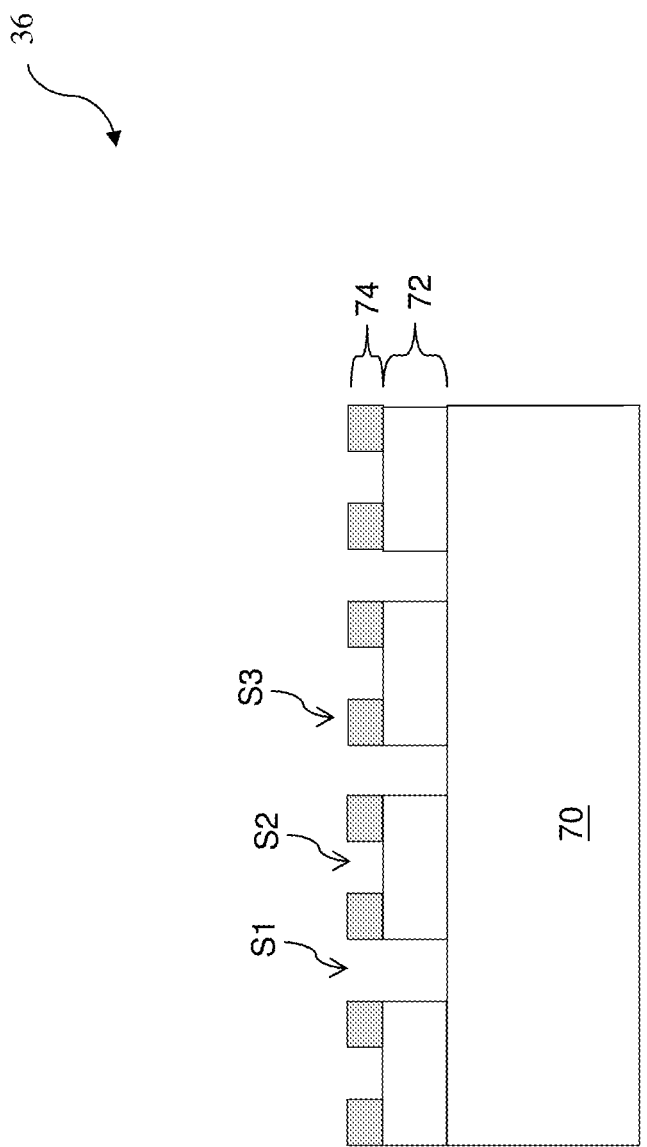

FIGS. 3-5 illustrate sectional views of the mask 36 at various fabrication stages, constructed in accordance to some embodiments. The mask 36 shown in FIG. 3 is blank at a mask fabrication stage prior to the patterning. The mask 36 includes a mask substrate 70 made of a material being transparent to the radiation light of the radiation source 32. In some examples, the transparent substrate 70 includes fused quartz or other suitable material, such as borosilicate glass and soda-lime glass relatively free of defects.

The mask 36 includes a first absorption material layer 72 formed over the substrate 70. In some embodiments, the first absorption material layer 72 is designed with its refractive index and thickness to provide phase shift, such as a phase shift of about 180 degree. In some embodiments, the first material layer 72 includes molybdenum silicide (MoSi) or other suitable material. The first absorption material, such as, allows the radiation light from the radiation source 32 to partially pass through, such as about 6% for example. In some other embodiments, the first absorption material layer 72 includes titanium nitride, tantalum nitride, tantalum, titanium, or aluminum-copper, palladium, tantalum nitride, aluminum oxide, molybdenum (Mo), other suitable material, or a combination thereof.

The mask 36 further includes a second absorption material layer 74 formed over the first absorption material layer 72. The second absorption material layer 74 absorbs the radiation light from the radiation source 32 projected onto the mask 36. In some embodiments, the second absorption material layer 74 is designed with its composition and thickness to substantially absorb the radiation light relative to the partial absorption of the radiation light by the first absorption material layer 72. In the present embodiment, the second absorption material layer 74 includes chromium (Cr), or other suitable materials.

One or more of the material layers 72 and 74 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Then, the absorption layers 72 and 74 are patterned to define three mask states S1, S2 and S3 according to an IC layout pattern (or simply IC pattern). Especially, three mask states define respectively various features of the IC pattern on the mask 36. In some embodiments, the three mask states have respective transmissivities different from each other. The patterning of the absorption material layers 72 and 74 may be implemented through a procedure that includes lithography process and etching. One embodiment of the patterning procedure is described below with reference to FIGS. 4 and 5.

Referring to FIG. 4, a first patterning operation is applied to the absorption material layers 72 and 74 to form the first mask state S1. A first patterning operation may include a first lithography process and a first etching process. The first lithography process may further include resist coating (e.g., spin-on coating), soft baking, mask aligning, exposure, post-exposure baking, developing the resist, rinsing, drying (e.g., hard baking), other suitable processes, and/or combinations thereof. Alternatively, the exposure process is implemented or replaced by other proper methods such as maskless photolithography, electron-beam writing, direct-writing, and/or ion-beam writing.

The first etching process is followed to remove portions of the absorption material layers 72 and 74, thereby forming the first mask state S1. The first etching process may include dry (plasma) etching, wet etching, and/or other etching methods. In the present embodiment, a multiple-step dry etching is implemented. The plasma etching starts to remove the second absorption material layer 74 by chlorine-based gas, and then proceeds to a second etching step to remove the first absorption material layer 72 by fluorine-based gas. Due to the nature of plasma chlorine-based gas and fluorine-based gas, the first step has a substantially high etching selectivity, particularly higher etch rate of Cr film relative to that of MoSi. The second etching step has a substantially high etching selectivity, particularly higher etch rate of MoSi film relative to that of Cr film.

Referring to FIG. 5, a second patterning operation is applied to the second absorption material layer 74 to form the second mask state S2 and the third mask state S3 on the mask 36. The second patterning operation includes a second lithography process and a second etching process, similar in many respects to those discussed above in association with the formation of the first mask state S1 except only the Cr film is removed within the openings of the patterned resist layer during the second etching process.

Still referring to FIG. 5, the mask 36 includes three mask states S1, S2 and S3. The transmissivities of mask states S1, S2 and S3 are t1, t2 and t3, respectively. By a proper configuration of each layer of the absorption material layers 72 and 74, such as film composition and film thickness, three mask states can achieve specified values of the transmissivities. In one embodiment, the first mask state S1 is defined on the regions that include the substrate 70, the second mask state S2 is defined on the regions that include the substrate 70 and the first absorption material layer 72, and the third mask state S3 is defined on the regions that include the substrate 70, the first absorption material layer 72 and the second absorption material layer 74. The three states are configured such that t1 is greater larger than t2 and t2 is larger than t3. The difference of the phases of the reflection coefficients of the mask state S1 and the mask state S2 is about 180° (out of phase). In the present embodiments, the third transmissity t3 is substantially zero.

Figure 6:
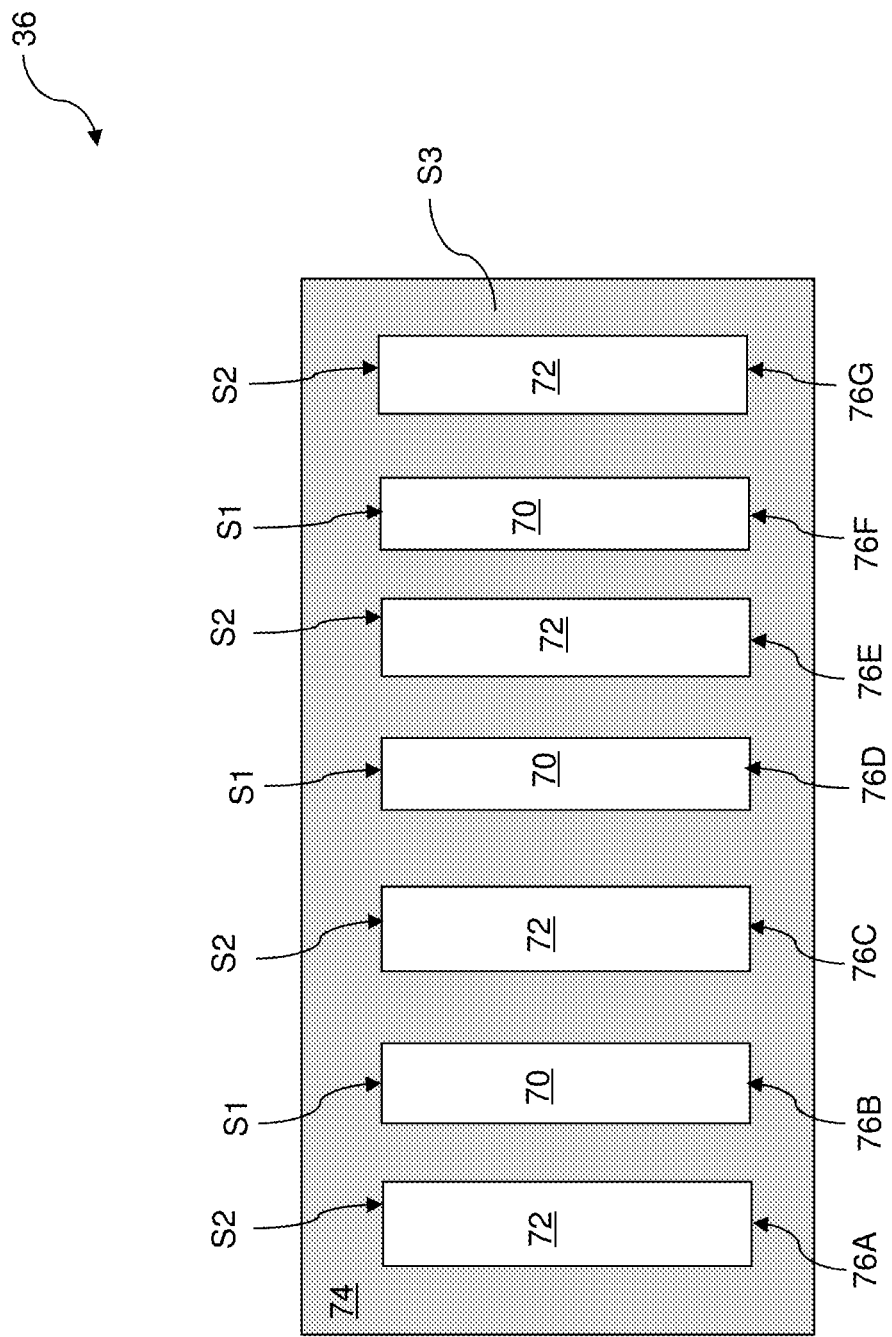
FIG. 6 is a top view of the mask in FIG. 5 constructed in accordance with some embodiments.

FIG. 6 is a top view of the mask 36 in FIG. 5, constructed in accordance with some embodiments. In some embodiments, the top layers for the first mask state S1, the second mask state S2 and the third mask state S3 are the substrate 70, the first absorption material layer 72 and the second absorption material layer 74, respectively. The mask 36 is patterned to define an IC pattern that includes a plurality of circuit features and a field as the background. The IC pattern may further include other features, such as dummy features or assist features. All those features are referred to as polygons. In some other embodiments, the circuit features may be further fractured to sub-features, which are also referred to as polygons. The IC pattern includes a plurality of polygons 76, such as 76A-76G in FIG. 6. The mask states S1 and S2 of the mask 36 are assigned to adjacent polygons. For examples, polygons 76B and 76C are adjacent from each other, separated from each other only by the field. The polygons 76B and 76C are defined on the first mask state S1 and the second mask state S2, respectively. The field is defined in the third mask state S3, which represents the background region on the mask without polygons, as shown in FIG. 6.

Figure 7:
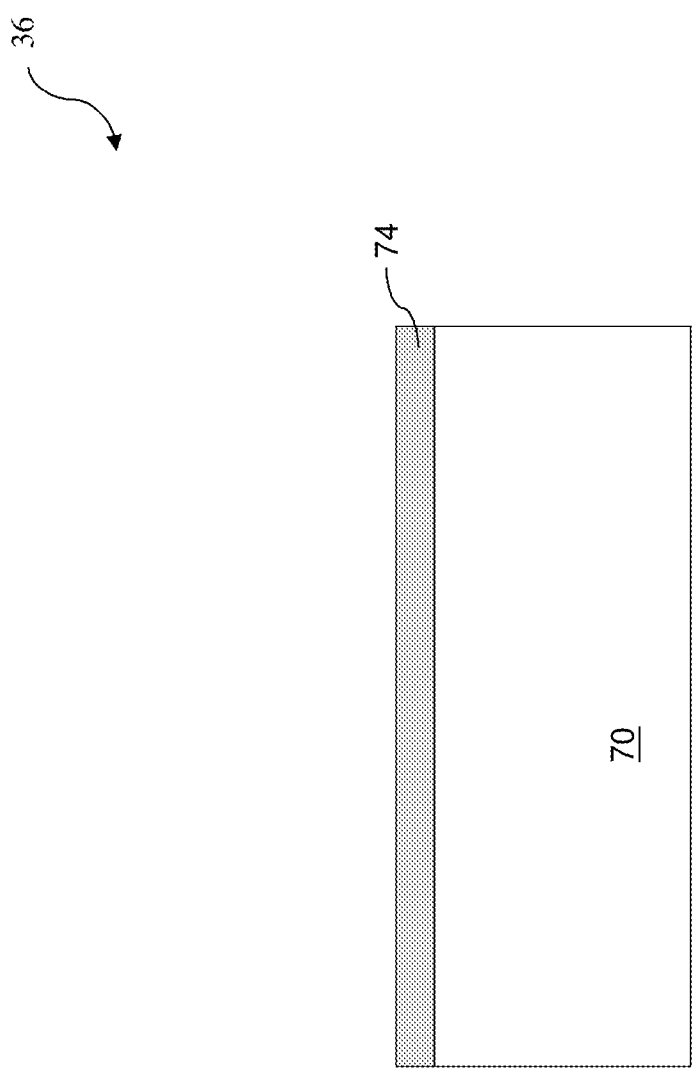
FIGS. 7-9 are cross-sectional views of a mask at various fabrication stages constructed in accordance with some other embodiments.
Figure 8:
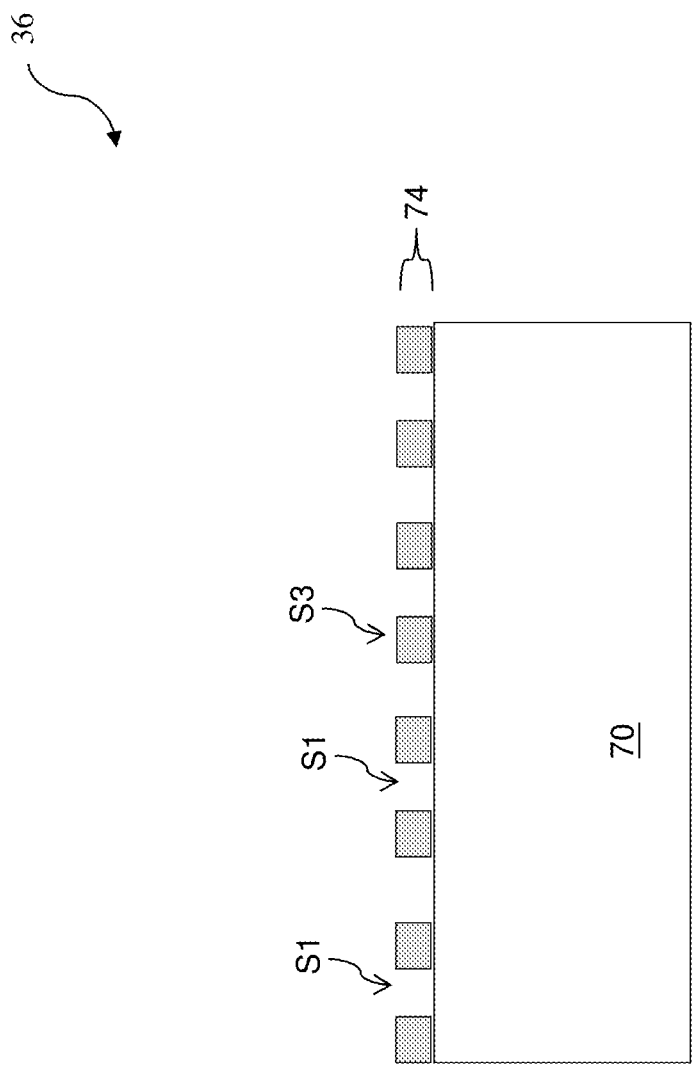
Figure 9:
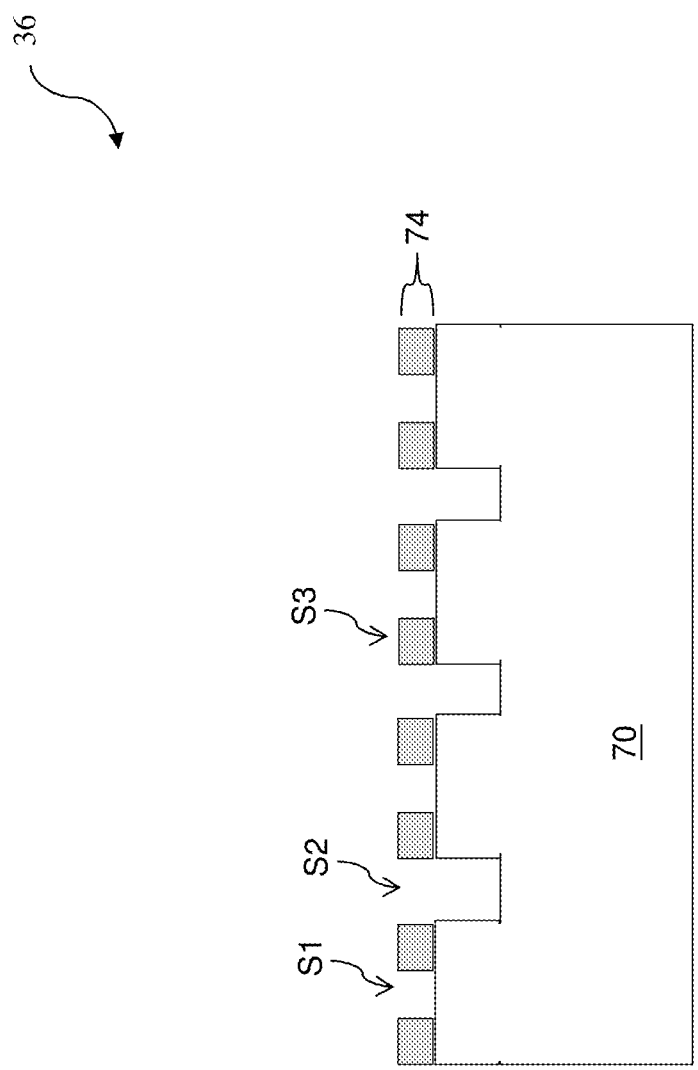

FIGS. 7-9 illustrate sectional views of the mask 36 at various fabrication stages, constructed in accordance to some other embodiments. The mask 36 shown in FIG. 7 is blank at a mask fabrication stage prior to the patterning. The mask 36 includes a mask substrate 70 made of a material being transparent to the radiation light of the radiation source 32. In some examples, the transparent substrate 70 includes fused quartz or other suitable material.

The mask 36 further includes an absorption material layer 74 formed over the substrate 70. In some embodiments, the absorption material layer 74 absorbs the radiation light from the radiation source 32 projected onto the mask 36. In some embodiments, the absorption material layer 74 is designed with its composition and thickness to substantially absorb the radiation light. In the present embodiment, the absorption material layer 74 includes chromium (Cr), or other suitable materials.

The absorption material layer 74 may be formed by various methods, such as those described above to form the second absorption material layer 74 of FIG. 3. For example, the absorption material layer 74 may be deposited by PVD, CVD (e.g., APCVD, LPCVD, PECVD or HDP CVD), ion beam deposition, spin-on coating, MOD, and/or other methods known in the art.

Then, the absorption layer 74 and the substrate 70 are patterned to define three mask states S1, S2 and S3 according to an IC layout pattern. Especially, three mask states define respectively various features of the IC pattern on the mask 36. The patterning of the absorption material layer 74 and the substrate 70 may be implemented through a procedure that includes lithography process and etching. One embodiment of the patterning procedure is described below with reference to FIGS. 8 and 9.

Referring to FIG. 8, a first patterning operation is applied to the absorption material layer 74 to form the first mask state S1 and the third mask state S3. A first patterning operation may include a first lithography process and a first etching process. The lithography process forms a patterned resist layer with a plurality of openings defined therein. The first etching process is applied to remove portions of the absorption material layer 74 within the opening of the patterned resist layer, thereby forming the first mask state S1. The first etching process is designed to selectively etch the absorption material layer 74. Specifically, the first etching process has a higher etch rate of the absorption material layer 74 relative to that of the substrate 70. The first etching process may include dry (plasma) etching, wet etching, and/or other etching methods. In the present embodiment, the first etching process is similar to the etching step applied to the second absorption material layer 74 of FIG. 4. For example, a plasma etching process with a chlorine-based gas is applied to the absorption material layer 74 to remove portions of the absorption material layer 74.

Referring to FIG. 9, a second patterning operation is applied to the substrate 70 to form the second mask state S2 on the mask 36. The second patterning operation includes a second lithography process and a second etching process. The second etching process is designed to selectively etch the substrate 70. The substrate 70 is selectively recessed within the openings of an etch mask. The etch mask may be defined by a patterned resist layer or a combination of the patterned resist layer and the patterned absorption material layer 74. The second etching process may include plasma etch, wet etch or other suitable etch. In some examples, the second etching process includes a plasma etch with fluorine-based gas, such as a gas containing CF4, SF6, NF3, or a combination thereof. In some other examples, the second etching process includes a wet etch with a hydrofluoric (HF) solution. In the present embodiment, the depth of the recessed substrate 70 is controlled according to the refractive index such that the phase difference between a first radiation light directed to the non-recessed substrate and a second radiation light directed to the recessed substrate is about 180 degree (out of phase).

Alternatively, the formation of the mask 36 may have a different fabrication sequence. For example, a first etching process may be applied to the substrate 70 to recess the substrate 70, thereby defining the second mask state S2, before the deposition of the absorption material layer 74. Afterward, the absorption material layer 74 is deposited on the patterned substrate 70. A second etching process is followed to pattern the absorption material layer 74.

Still referring to FIG. 9, the mask 36 includes three mask states S1, S2 and S3. The transmissivities of mask states S1, S2 and S3 are t1, t2 and t3, respectively. In the present embodiment, the first mask state S1 is defined on the regions that include the non-recessed substrate 70, the second mask state S2 is defined on the regions that include the recessed substrate 70, and the third mask state S3 is defined on the regions that include the substrate 70 and the absorption material layer 74. The three states are configured such that t1 and t2 are substantially equal and are substantially greater than t3. The difference of the phases of the reflection coefficients of the mask state S1 and the mask state S2 is about 180° (out of phase). In the present embodiment, the third transmissity t3 is substantially zero.

Figure 10:
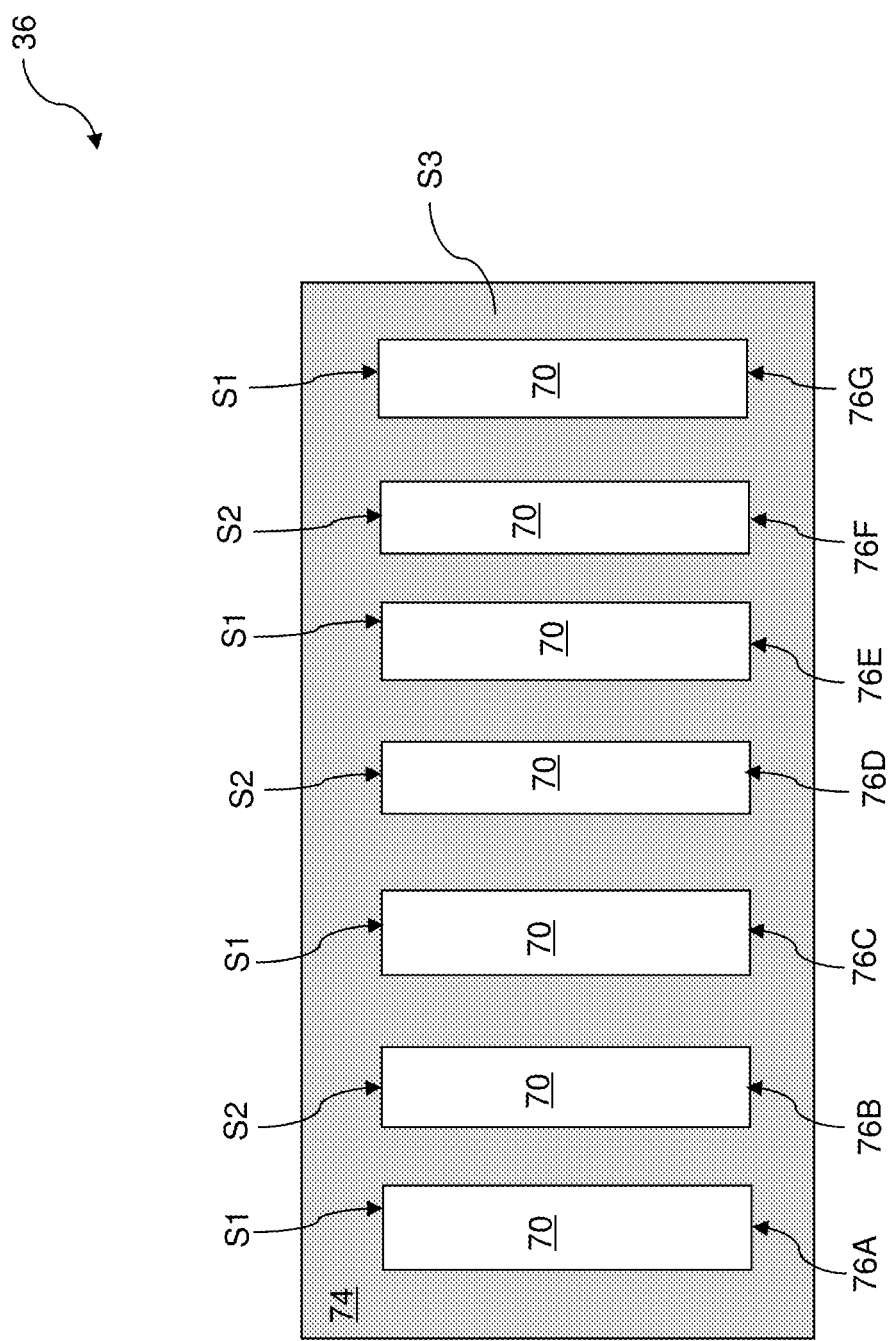
FIG. 10 is a top view of the mask in FIG. 9 constructed in accordance with some embodiments.

FIG. 10 is a top view of the mask 36 in FIG. 9, constructed in accordance with some embodiments. In some embodiments, the top layers for the first mask state S1, the second mask state S2 and the third mask state S3 are the substrate 70 (non-recessed), the substrate 70 (recessed) and the absorption material layer 74, respectively. The mask 36 is patterned to define an IC pattern that includes a plurality of polygons and a field as the background. In the present example illustrated in FIG. 10, the IC pattern includes polygons 76A-76G. The mask states S1 and S2 of the mask 36 are assigned to adjacent polygons. For examples, polygons 76C and 76D are adjacent from each other, separated from each other only by the field. The polygons 76C and 76D are defined on the first mask state S1 and the second mask state S2, respectively. The field is defined in the third mask state S3, which represents the background region on the mask without polygons, as shown in FIG. 10.

Referring back to FIG. 1, the operation 12 in the method 10 may further include other steps, such as alignment after the mask 36 is secured on the mask stage.

The method 10 also includes an operation 14 to load a target 40 to the substrate stage 42 of the lithography system 30. In the present embodiment, the target 40 is a semiconductor substrate, such as a silicon wafer. The target 40 is coated with a resist layer that is sensitive to the radiation light. The resist layer is to be patterned by a lithography exposure process such that the IC pattern of the mask 36 is transferred to the resist layer.

Referring to FIG. 1, the method 10 includes an operation 16 by setting the illuminator 34 of the lithography system 30 in a nearly on-axis illumination mode (ONI). The illumination mode is configured with a partial coherence σ less than about 0.3 to produce diffracted light and non-diffracted light. Referring to FIG. 11, an incident light ray 80, after being reflected from the mask 36, is diffracted into various diffraction orders due to presence of these mask patterns, such as a 0-th diffraction order ray 82, a −1-st diffraction order ray 84 and a +1-st diffraction order ray 86. In the depicted embodiment, the non-diffracted light rays 82 are mostly removed by the pupil filter 88. The −1-st and +1-st diffraction order rays, 84 and 86, are collected by the POB 38 and directed to expose the target 40.

Figure 12:
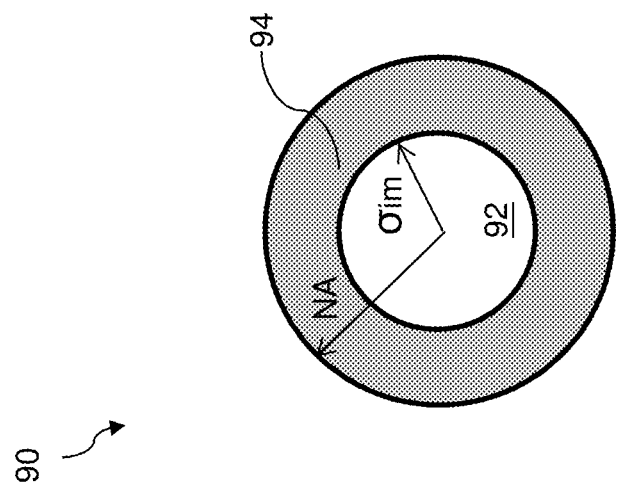
FIG. 12 illustrates a schematic view of an illumination pattern implemented by the method of FIG. 1, constructed in accordance with some embodiments.

The on-axis illumination mode may be achieved by a mechanism, like an aperture with a certain illumination pattern, such as a disk illumination pattern 90 illustrated in FIG. 12, constructed in accordance with some embodiments. The illumination pattern 90 includes an illuminated portion 92 and a blocked portion 94. However, the aperture causes the radiation loss. The aperture is configured at the illumination pupil plane in the lithography system 30 to achieve the on-axis illumination mode.

In some embodiments, the illuminator 34 includes various switchable lenses or other optical components with other suitable mechanism to tune the transmissivities of the radiation light from those lenses or other suitable optical components. In furtherance of the present embodiment, the on-axis illumination mode is achieved by configuring the switchable lenses in the illumination stage to achieve the on-axis illumination. The illumination pattern 90 is further defined by a parameter $\sigma_{im}$, which is the radius of the illuminated portion 92, evaluated relative to NA that is the numerical aperture. In some embodiments, the parameter $\sigma_{im}$ is chosen to be less than about 0.3, which means that $\sigma_{im}$/NA is less than about 0.3. In some embodiments, the illumination pattern 90 may be determined according to the IC pattern.

Referring to FIG. 1, the method 10 may include an operation 18 by configuring a pupil filter in the lithography system 30. The pupil filter is configured in a projection pupil plane of the lithography system 30. In an image optical system, the projection pupil plane has a field distribution corresponding to Fourier Transform of object (the mask 36 in the present case). The pupil filter is placed in the projection pupil plane to filter out specific spatial frequency components of the radiation light from the mask 36.

Figure 13:
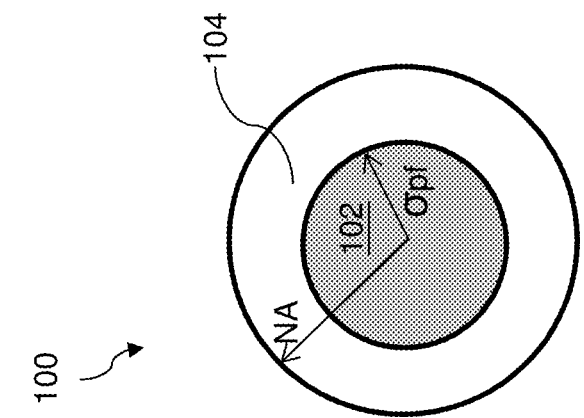
FIG. 13 illustrates a schematic view of a filtering pattern implemented by the method of FIG. 1, constructed in accordance with some embodiments.

The pattern defined in the pupil filter is determined by the illumination mode. The pattern of the pupil filter is designed to remove at least a portion of the non-diffracted light from the mask 36, such as at least about 70%, in intensity, of the non-diffracted light, which is the 0-th order diffraction light from the mask 36. In some embodiments, the pattern in the pupil filter is substantially complimentary to the pattern of the illumination mode. For example, when the illumination pattern 90 is defined as a disk pattern in FIG. 12, the corresponding pattern of the pupil filter is a similar but reversed pattern 100 (filtering pattern 100) as illustrated in FIG. 13. The filtering pattern 100 includes a blocking portion 102 (a similar disk) and a collecting portion 104. The radiation light reaching the blocking portion 102 in the pupil plane will be blocked. The radiation light reaching the collecting portion 104 in the pupil plane will be collected by POB 38 and be directed to the target 40. The filtering pattern 100 is further defined by a parameter $\sigma_{pf}$, which is the radius of the blocking portion 102. Here $\sigma_{pf}$ is evaluated relative to NA. In some examples, the illumination pattern 90 has a disk illumination with a partial coherence $\sigma_{im}$ less than about 0.3. The filtering pattern 100 is determined according to the illumination pattern 90 so that most of the non-diffracted light is removed by the pupil filter 100, such as more than 70% of the non-diffracted light is removed, thereby utilizing mainly the diffracted light from two symmetrically located (on the pupil plane) and intensity balanced −1-st and +1-st diffraction orders to expose a semiconductor wafer. In some embodiments noted above, the illumination pattern 90 is complimentary to the filtering pattern 100, formulated as $\sigma_{pf}=\sigma_{im}$. In some embodiments, the filtering pattern may be slightly different from the illumination pattern, formulated as $\sigma_{pf}>\sigma_{im}$. Collectively, the filtering pattern is determined by the illumination pattern, formulated as $\sigma_{pf}\geq\sigma_{im}$. In one example where $\sigma_{im}$ is less than 0.3, $\sigma_{pf}$ is equal to or greater than 0.3.

Referring back to FIG. 1, the method 10 proceeds to operation 20 by performing a lithography exposure process to the target 40 in the configured illumination mode and the pupil filter. The radiation light from the radiation source 32 is modulated by the illuminator 34 with the radiation energy distribution for the on-axis illumination, directed from the mask 36, and further filtered by the pupil filter, the radiation light images the IC pattern of the mask 36 to the target 40 with enhanced energy latitude (EL) and DOF.

Still referring back FIG. 1, the method 10 may further include other operations. For example, the method 10 includes an operation 22 by developing the exposed resist layer coated on the target 40, thereby forming a patterned resist layer with one or more openings imaged from the IC pattern defined on the mask 36.

In another example, the method 10 further includes an operation 24 by performing a fabrication process to the target 40 through the patterned resist layer. In one embodiment, the substrate or a material layer of the target is etched through the openings of the patterned resist layer, thereby transferring the IC pattern to the substrate or the underlying material layer. In furtherance of the embodiment, the underlying material layer is an interlayer dielectric (ILD) layer disposed on the semiconductor substrate. The etching process will form contacts or vias in the corresponding ILD layer. In another embodiment, an ion implantation process is applied to the semiconductor substrate through the openings of the patterned resist layer, thereby forming doped features in the semiconductor substrate according to the IC pattern. In this case, the patterned resists layer functions as an ion implantation mask.

Various embodiments of the method 10 and the mask 36 are described according to the present disclosure. Other alternatives and modifications may present without departure from the spirit of the present disclosure. In one embodiment, the IC pattern defined on the mask 36 may further include various dummy polygons and/or assist polygons incorporated by an OPC process. In one example, the assist polygons are assigned to a same state. For example, the dummy polygons are assigned with the main polygons of the IC pattern such that adjacent polygons are assigned to different mask states. In various examples, the resist material coated on the target to receive the lithography exposure process may be a positive tone resist or negative tone resist.

Figure 14A:
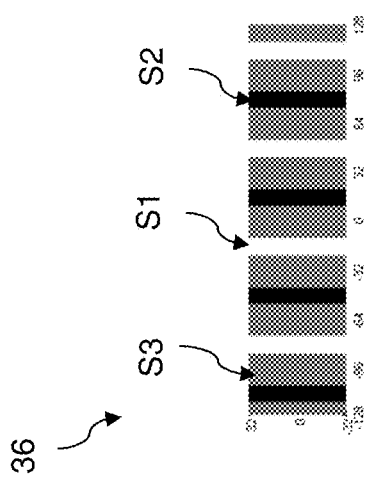
FIG. 14A is a top view of a mask constructed in accordance with some embodiments.
Figure 14B:
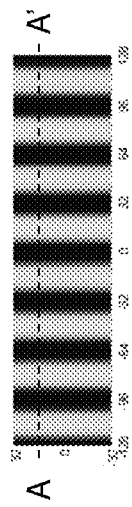
FIG. 14B is a diagrammatic view of the exposure energy distribution in gray scale associated with the mask of FIG. 14A.
Figure 14C:
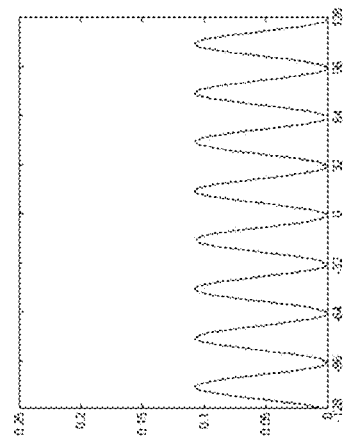
FIG. 14C is a diagrammatic view of the exposure energy distribution in diagram associated with the mask of FIG. 14A.

Furthermore, the mask 36 and the method 10 may be used to form various IC pattern with enhanced imaging effect. First example is illustrated in FIGS. 14A through 14C. FIG. 14A illustrates a top view of the mask 36 in accordance with some embodiments. The first mask state S1, the second mask state S2 and third mask state S3 are labeled respectively. FIG. 14B illustrates the corresponding exposure energy distribution on the resist layer in gray scale. FIG. 14C illustrates the corresponding exposure energy distribution along the line AA' on the resist layer in diagram where the horizontal axis represents the distance along the line AA' and the vertical axis represents the exposure energy. The IC pattern defined on the mask 36 includes a plurality of line features. Lines and spacing between the lines are clearly imaged by the method 10.

Figure 15B:
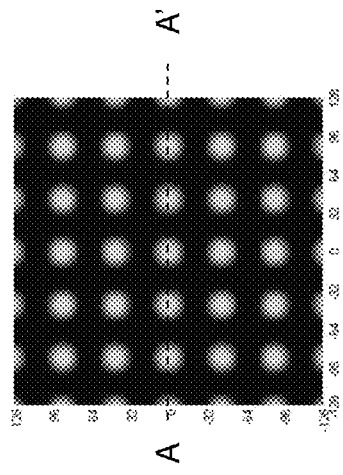
FIG. 15B is a diagrammatic view of the exposure energy distribution in gray scale associated with the mask of FIG. 15A.
Figure 15C:
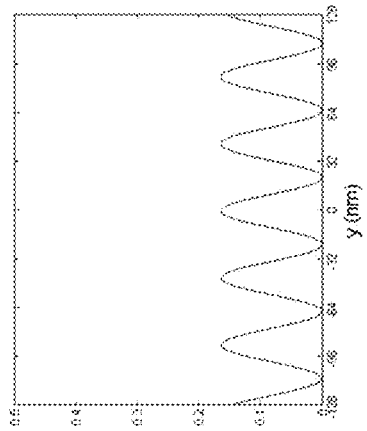
FIG. 15C is a diagrammatic view of the exposure energy distribution in diagram associated with the mask of FIG. 15A.
Figure 15A:
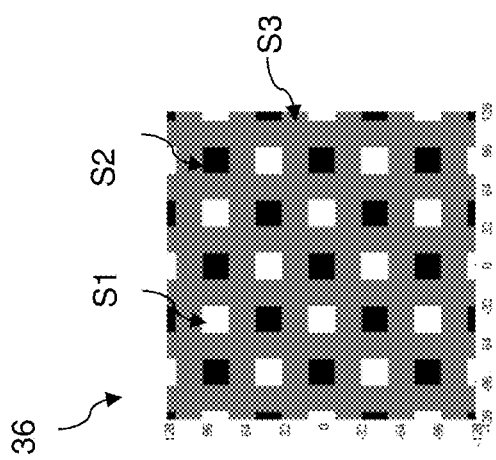
FIG. 15A is a top view of a mask constructed in accordance with some embodiments.

Second example is illustrated in FIGS. 15A through 15C. FIG. 15A illustrates a top view of the mask 36 in accordance with some embodiments. The first mask state S1, the second mask state S2 and third mask state S3 are labeled respectively. FIG. 15B illustrates the corresponding exposure energy distribution on the resist layer in gray scale. FIG. 15C illustrates the corresponding exposure energy distribution along the line AA' on the resist layer in diagram where the horizontal axis represents the distance along the line AA' and the vertical axis represents the exposure energy. The IC pattern defined on the mask 36 includes a plurality of hole features (such as contact holes) in array. Hole features are clearly imaged by the method 10 with enhanced contrast.

Figure 16A:
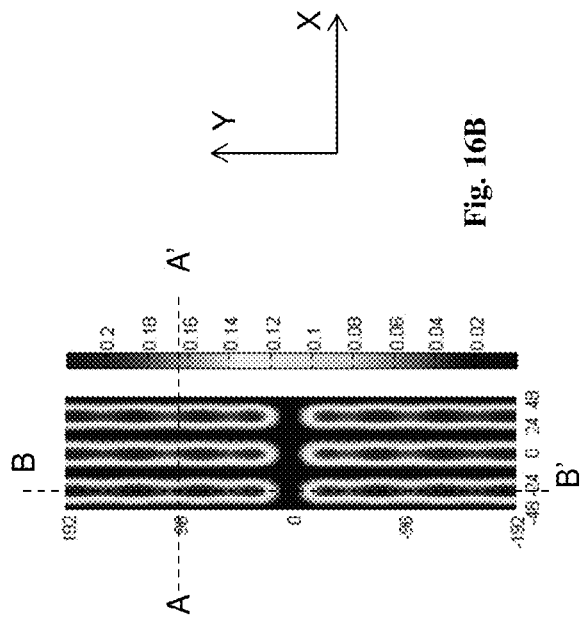
FIG. 16A is a top view of a mask constructed in accordance with some embodiments.
Figure 16B:
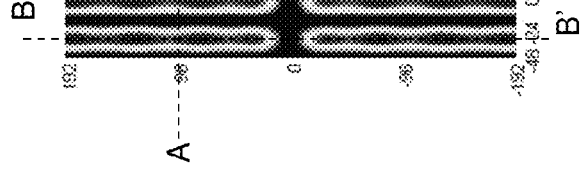
FIG. 16B is a diagrammatic view of the exposure energy distribution in gray scale associated with the mask of FIG. 16A.
Figure 16C:
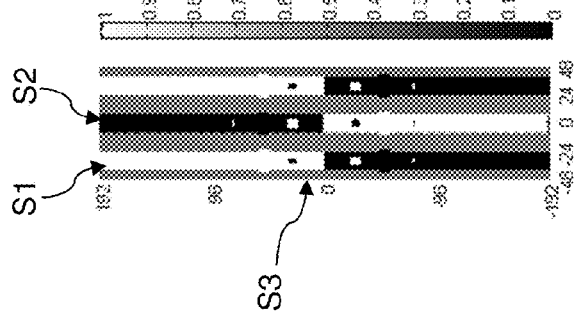
FIG. 16C is a diagrammatic view of the exposure energy distribution in diagram along X direction associated with the mask of FIG. 16A.
Figure 16D:
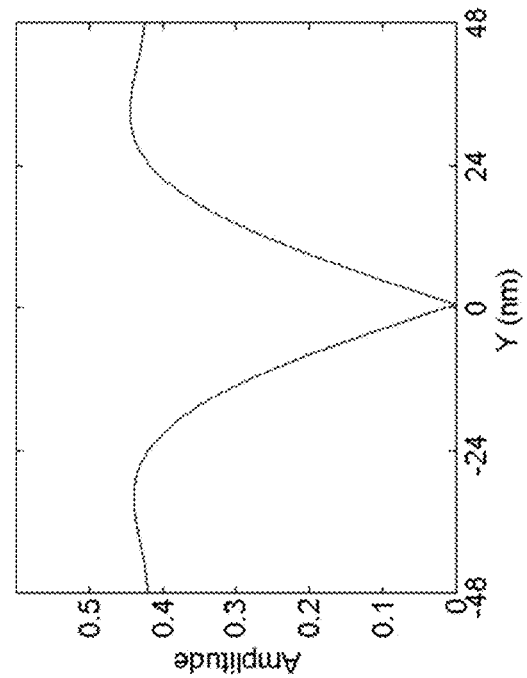
FIG. 16D is a diagrammatic view of the exposure energy distribution in diagram along Y direction associated with the mask of FIG. 16A.

Third example is illustrated in FIGS. 16A through 16D. FIG. 16A illustrates a top view of the mask 36 in accordance with some embodiments. The first mask state S1, the second mask state S2 and third mask state S3 are labeled respectively. FIG. 16B illustrates the corresponding exposure energy distribution on the resist layer in gray scale. FIG. 16C illustrates the corresponding exposure energy distribution along the line AA' on the resist layer in diagram and FIG. 16D illustrates the corresponding exposure energy distribution along the line BB' on the resist layer in diagram. The IC pattern defined on the mask 36 includes a plurality of lines. The line/spacing in the X direction and the line end to end in the Y direction both achieve the highest contrast simultaneously.

In another embodiment, an lithography process includes forming a mask with three states, assigning different states of the mask to adjacent polygons and a field, exposing the mask by nearly an on-axis illumination (ONI) with partial coherence σ less than 0.3 to produce diffracted light and non-diffracted light, removing more than 70% of the non-diffracted light, and collecting and directing the diffracted light and the not removed non-diffracted light by a projection optics box (POB) to expose the target 40.

The embodiments of the present disclosure offer advantages over existing art, though it is understood that other embodiments may offer different advantages, not all advantages are necessarily discussed herein, and that no particular advantage is required for all embodiments. In some embodiment, the aerial image contrast is enhanced by using the pupil filter to remove most of the non-diffracted light.

Figures 17A, 17B:
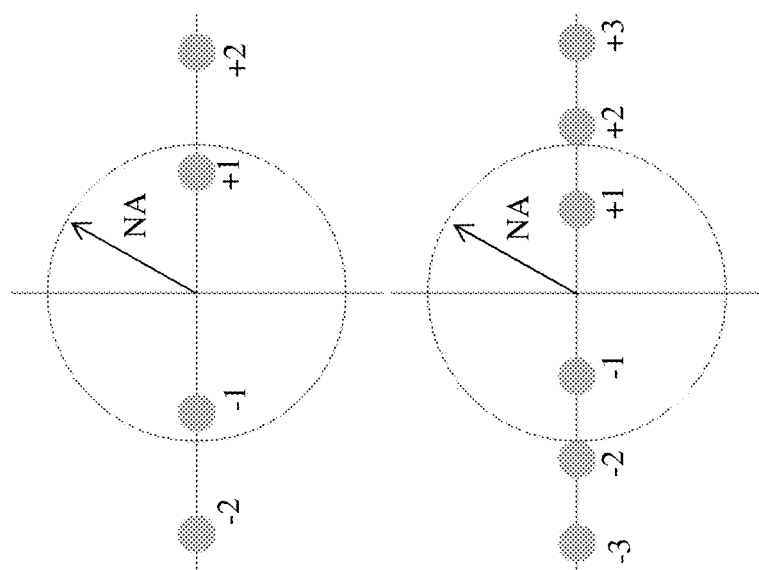
FIGS. 17A and 17B illustrate diagrammatic views of a numerical aperture and diffracted light from the mask constructed in accordance with some embodiments.

In some embodiments, the method 10 can achieve the same minimum pitch as that by off-axis illumination (OAI) under the given NA. When OAI is used, since the location of the 0th diffraction order on the pupil plane is fixed, the DOF starts to degrade once the pitch is deviated from the optimized pitch. The DOF is almost minimum for $P>1.5 \times P_{min}$. Since in the pitch range of $1.5 \times P_{min} \sim 2 \times P_{min}$, implementing assist feature (AF) is not helpful in increasing the DOF. There is the forbidden-pitch problem. By using the method 10, the DOF remains maximized until the 2nd diffraction orders come in. That is, the DOF is maximized in the pitch range of $1 \times P_{min} \sim 2 \times P_{min}$, as illustrated FIGS. 17A and 17B. There is no forbidden-pitch problem.

The +1-st and −1-st diffraction orders are balanced in strength, the energy latitude is maximized. Furthermore, on the pupil plane, since +1-st and −1-st diffraction orders are of the same distance (such as illustrated in FIG. 11) from the pupil center, DOF is also maximized simultaneously.

The present disclosure provides a lithography process in accordance with some embodiments. The lithography process in a lithography system includes loading a mask having multiple mask states and having a mask pattern consisting of a plurality of polygons and a field. Different mask states are assigned to adjacent polygons and the field. The lithography process further includes configuring an illuminator to generate an illumination pattern on an illumination pupil plane of the lithography system; configuring a pupil filter on a projection pupil plane of the lithography system with a filtering pattern determined according to the illumination pattern; and performing an exposure process to a target with the illuminator, the mask, and the pupil filter. The exposure process produces diffracted light and non-diffracted light behind the mask and the pupil filter removes most of the non-diffracted light.

In some embodiments of the lithography process, the illumination pattern has an illuminated portion $\sigma_{im}$, wherein $\sigma_{im}$ is less than 0.3. In some other embodiments of the lithography process, the illumination pattern has an illuminated portion $\sigma_{im}$; and the filtering pattern has a blocking portion $\sigma_{pf}$, wherein $\sigma_{pf} \geq \sigma_{im}$.

The present disclosure also provides a mask in accordance with some embodiments. The mask includes a transparent substrate; a first absorption material layer over the transparent substrate; and a second absorption material layer over the first absorption material layer. The first and second absorption material layers are patterned to define a first mask state, a second mask state and a third mask state having respective transmissivities t1, t2 and t3. The first and second mask states are out of phase. A first polygon is defined in the first mask state, a second polygon adjacent to the first polygon is defined in the second mask state and a field is defined in the third mask state. In some embodiments of the mask, t1>t3 and t2>t3.

The present disclosure also provides a mask in accordance with some embodiments. The mask includes a transparent substrate; and an absorption material layer over the transparent substrate. The absorption material layer and the transparent substrate are patterned to define a first mask state; a second mask state and a third mask state being different form each other. The first and second mask states are out of phase. The first, second and third mask states have respective transmissivities t1, t2, and t3, t1 is equal to t2. A first polygon is defined in the first mask state, a second polygon adjacent to the first polygon is defined in the second mask state and a field is defined in the third mask state.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography process in a lithography system, comprising:
loading a mask having multiple mask states and having a mask pattern consisting of a plurality of polygons and a field, wherein different mask states are assigned to adjacent polygons and the field, and wherein the mask pattern includes a first polygon defined in a first mask state, a second polygon adjacent to the first polygon and defined in a second mask state such that the first and second polygons physically contact each other, a third polygon defined in the second mask state, and a field defined in a third mask state, such that the first and third polygons are separated by a portion of the field, wherein the first, second, and third mask states have respective transmissivities t1, t2, and t3, wherein t1, t2, and t3 are different from each other and t3 is less than t1 and t2;
configuring an illuminator to generate an illuminating pattern on an illumination pupil plane of the lithography system;
configuring a pupil filter on a projection pupil plane of the lithography system with a filtering pattern determined according to the illumination pattern; and
performing an exposure process to a target with the illuminator, the mask, and the pupil filter, wherein the exposure process produces diffracted light and non-diffracted light behind the mask and the pupil filter removes most of the non-diffracted light.

2. The lithography process of claim 1, wherein the illumination pattern corresponds to an on-axis illumination.

3. The lithography process of claim 1, wherein the illumination pattern corresponds to a partially coherent illumination.

4. The lithography process of claim 1, wherein the illumination pattern has an illuminated portion $\sigma_{pf}$, wherein $\sigma_{im}$ is less than 0.3.

5. The lithography process of claim 1, wherein
the illumination pattern has an illuminated portion $\sigma_{im}$; and
the filtering pattern has a blocking portion $\sigma_{pf}$ wherein $\sigma_{pf} \geq \sigma_{im}$.

6. The lithography process of claim 1, wherein the first, second, and third mask states have phases $\phi 1$, $\phi 2$, and $\phi 3$, respectively, wherein $\phi 1$, $\phi 2$, and $\phi 3$ are different from each other.

7. The lithography process of claim 1, wherein the first and second mask states are out of phase.

8. The lithography process of claim 1, wherein t3 is substantially zero.

9. The lithography process of claim 8, wherein the mask includes
a transparent substrate;
a first absorption material layer formed over the transparent substrate; and
a second absorption material layer formed over the first absorption material layer,
wherein the first and second absorption material layers are patterned to define the first, second and third mask states being different from each other.

10. The lithography process of claim 9, wherein
the first absorption material layer includes molybdenum silicide (MoSi); and
the second absorption material layer includes chromium (Cr).

11. The lithography process of claim 10, wherein
the first mask state is defined in first regions including the transparent substrate and being free of the first and second absorption material layers;
the second mask state is defined in second regions including the transparent substrate and the first absorption material layer, and being free of the second absorption material layer; and
the third mask state is defined in third regions including the transparent substrate, the first absorption material layer and the second absorption material layer.

12. The lithography process of claim 1, wherein the mask includes
a transparent substrate; and
an absorption material layer formed over the transparent substrate,
wherein the absorption material layer and the substrate are patterned to define the first, second, and third mask states being different from each other.

13. The lithography process of claim 12, wherein the absorption material layer includes chromium (Cr).

14. The lithography process of claim 13, wherein
the first mask state is defined in first regions including the transparent substrate and being free of the absorption material layer;
the second mask state is defined in second regions including the transparent substrate, and being free of the absorption material layer, wherein the transparent substrate in the second regions are recessed relative to the transparent substrate in the first regions; and
the third mask state is defined in third regions including the transparent substrate and the absorption material layer.

15. A mask, comprising:
a transparent substrate:
a first absorption material layer over the transparent substrate; and
a second absorption material layer over the first absorption material layer, wherein
the first and second absorption material layers are patterned to define a first mask state, a second mask state and a third mask state having respective transmissivities t1, t2, and t3, wherein t1, t2, and t3 are different from each other and t3 is less than t1 and t2;
the first and second mask states are out of phase; and
a first polygon defined in the first mask state, a second polygon adjacent to the first polygon and defined in the second mask state such that the first and second polygons physically contact each other, a third polygon defined in the second mask state, and a field defined in the third mask state such that the first and third polygons are separated by a portion of the field.

16. The mask of claim 15, wherein
the first absorption material layer includes molybdenum silicide (MoSi),
the second absorption material layer includes chromium (Cr), and
t3 is substantially zero.

17. The mask of claim 16, wherein
the first mask state is defined in first regions including the transparent substrate and being free of the first and second absorption material layers;
the second mask state is defined in second regions including the transparent substrate and the first absorption material layer, and being free of the second absorption material layer; and the third mask state is defined in third regions including the transparent substrate, the first absorption material layer, and the second absorption material layer.

18. A mask, comprising:
a transparent substrate; and
an absorption material layer over the transparent substrate, wherein the absorption material layer and the transparent substrate are patterned to define a first mask state, a second mask state and a third mask state being different form each other,
the first and second mask states are out of phase,
the first, second and third mask states have respective transmissivities $t1$, $t2$ and $t3$, wherein $t3$ is less than $t1$ and $t2$, and
a first polygon defined in the first mask state, a second polygon adjacent to the first polygon and defined in the second mask state such that the first and second polygons physically contact each other, a third polygon defined in the second mask state, and a field defined in the third mask state such that the first and third polygons are separated by a portion of the field.

19. The mask of claim 18, wherein $t3$ is zero; and the absorption material layer includes chromium (Cr).

20. The mask of claim 19, wherein
the first mask state is defined in first regions including the transparent substrate and being free of the absorption material layer;
the second mask state is defined in second regions including the transparent substrate, and being free of the absorption material layer, wherein the transparent substrate in the second regions are recessed relative to the transparent substrate in the first regions; and
the third mask state is defined in third regions including the transparent substrate and the absorption material layer.

* * * * *